(12) United States Patent
Huang et al.

(10) Patent No.: US 9,525,081 B1
(45) Date of Patent: Dec. 20, 2016

(54) METHOD OF FORMING A BIFACIAL SOLAR CELL STRUCTURE

(71) Applicant: INVENTEC SOLAR ENERGY CORPORATION, Taoyuan (TW)

(72) Inventors: Yu-Hsiang Huang, Taoyuan (TW); Yu Ta Cheng, Taoyuan (TW); Chuan Chi Chen, Taoyuan (TW); Chia-Lung Lin, Taoyuan (TW); Chin-Pao Taso, Taoyuan (TW); Jung-Wu Chien, Taoyuan (TW); Haw Yen, Taoyuan (TW)

(73) Assignee: INVENTEC SOLAR ENERGY CORPORATION, Taoyuan (TW)

( * ) Notice: Subject to any disclaimer, the term of this patent is extended or adjusted under 35 U.S.C. 154(b) by 0 days.

(21) Appl. No.: 14/981,074

(22) Filed: Dec. 28, 2015

(51) Int. Cl.
| | | |
|---|---|---|
| *H01L 31/05* | (2014.01) | |
| *H01L 31/00* | (2006.01) | |
| *H01L 31/18* | (2006.01) | |
| *H01L 31/0224* | (2006.01) | |
| *H01L 31/0236* | (2006.01) | |
| *H01L 31/0216* | (2014.01) | |

(52) U.S. Cl.
CPC ... *H01L 31/02168* (2013.01); *H01L 31/02366* (2013.01); *H01L 31/1864* (2013.01)

(58) Field of Classification Search
CPC .................. H01L 31/022425; H01L 31/1804; H01L 31/02363; H01L 31/068
USPC ........ 257/E31.001, E31.119; 438/71, 57, 72; 136/255, 256
See application file for complete search history.

(56) References Cited

U.S. PATENT DOCUMENTS

| | | | | |
|---|---|---|---|---|
| 3,886,582 | A * | 5/1975 | Kobayashi ............ | H01L 23/291 257/256 |
| 4,464,824 | A * | 8/1984 | Dickman .............. | H01L 21/768 148/DIG. 124 |
| 2005/0139542 | A1* | 6/2005 | Dickensheets ......... | B81B 3/007 210/490 |
| 2011/0214727 | A1* | 9/2011 | Esturo-Breton | H01L 31/022425 136/255 |
| 2015/0007881 | A1* | 1/2015 | Khadilkar ....... | H01L 31/022425 136/256 |

* cited by examiner

*Primary Examiner* — Kimberly Rizkallah
*Assistant Examiner* — Brian Turner
(74) *Attorney, Agent, or Firm* — Kirton McConkie; Evan R. Witt (57) ABSTRACT

A method of forming bifacial solar cell structure is described. The method comprises: performing boron diffusion on an upper surface of a semiconductor substrate to form a P+ region and a boron silicon glass (BSG) layer on the P+ region; stripping the BSG layer to expose the P+ region and stripping a blocking layer on a lower surface of the semiconductor substrate simultaneously; forming a first anti-reflection coating layer on the P+ region; forming sacrifice film on the first anti-reflection coating layer; performing phosphorus diffusion on the lower surface to form an N+ region and a phosphorus silicon glass (PSG) layer on the N+ region; stripping the PSG layer on the N+ region to expose the N+ region and stripping the sacrifice film on the first anti-reflection coating layer simultaneously; and forming a second anti-reflection coating layer on the N+ region.

17 Claims, 5 Drawing Sheets

METHOD OF FORMING A BIFACIAL SOLAR CELL STRUCTURE

BACKGROUND OF THE INVENTION

Field of Invention

The present invention relates to a method of forming a cell structure, and more particularly to a method of forming a bifacial solar cell structure.

Description of Prior Art

Conventionally, when a bifacial solar cell structure is manufactured, an N+ region diffusion, e.g. employing phosphorus oxychloride ($POCl_3$) as a liquid phosphorus source for the diffusion procedure, on a rear side of the bifacial solar cell structure is performed after an anti-reflection coating (ARC) layer, e.g. material composed of silicon nitride ($SiN_x$), is formed on an upper surface of the bifacial solar cell structure. However, phosphoric acid removes a portion of the $SiN_x$ layer at a higher etching rate, and further the etching rate is considerably raised with the increment of the manufacturing process temperature. Thus, after performing the N+ region diffusion on a rear side, some pin holes are disadvantageously formed by the phosphoric acid in the ARC layer on the upper surface of bifacial solar cell structure, which causes defects to be formed on the surface of ARC layer on the upper surface of the bifacial solar cell structure.

Furthermore, it is required to perform an electrical isolation procedure for integrating a unit in a manufacturing process of the bifacial solar cells by using a wet chemical etching, laser isolation or any other methods in the prior art. However, all the aforementioned methods require at least one extra process step of the bifacial solar cell manufacturing flow to perform and attain the electrical isolation. Therefore, it is inevitable to increase the whole process cost and decrease the yield due to the at least one extra process step.

Consequently, there is a need to develop a novel method of forming a bifacial solar cell structure.

SUMMARY OF THE INVENTION

One objective of the present invention is to provide a method of forming a bifacial solar cell structure for protecting a first anti-reflection coating layer and two opposed side portions of a semiconductor substrate from phosphorus diffusion by using a sacrifice film so that pin holes or defects are not formed on the first anti-reflection coating layer.

Another objective of the present invention is to provide a method of forming bifacial solar cell structure for forming the first anti-reflection coating layer to be simultaneously disposed on the two opposed side portions of the semiconductor substrate for electrically insulating the P+ region from the N+ region.

According to the above objectives, the present invention sets forth a method of forming a bifacial solar cell structure, comprising the steps of: performing boron diffusion on an upper surface of a semiconductor substrate to form a P+ region and a boron silicon glass (BSG) layer on the P+ region; stripping the BSG layer on the P+ region to expose the P+ region; forming a first anti-reflection coating layer on the P+ region; forming a sacrifice film on the first anti-reflection coating layer; performing phosphorus diffusion on a lower surface of the semiconductor substrate to form an N+ region and a phosphorus silicon glass (PSG) layer on the N+ region; stripping the PSG layer on the N+ region to expose the N+ region and stripping the sacrifice film on the first anti-reflection coating layer simultaneously; and forming a second anti-reflection coating layer on the N+ region.

In one embodiment, before the step of performing the boron diffusion on the upper surface of the semiconductor substrate to form the P+ region and the BSG layer on the P+ region, the alkaline etching is performed on the semiconductor substrate to form a texture structure on each of the upper surface and the lower surface of the semiconductor substrate, respectively; and a blocking layer is formed on the lower surface of the semiconductor substrate.

In one embodiment, the blocking layer is selected from either an organic material or an inorganic material, wherein the organic material is formed by one of chemical vapor deposition, screen printing, inkjet printing and spin coating, and wherein the inorganic material is selected from the group consisting of silicon oxide, silicon oxynitride and silicon nitride, and is formed by one of chemical vapor deposition, screen printing, inkjet printing and spin coating.

In one embodiment, the first anti-reflection coating layer is either a single-layer structure or a multi-layer structure, wherein the single-layer structure is selected from the group consisting of silicon oxide, silicon oxynitride, aluminum oxide and silicon nitride, and the multi-layer structure is selected from the group consisting of silicon oxide, silicon oxynitride, aluminum oxide, silicon nitride and combinations thereof.

In one embodiment, during the step of performing the phosphorus diffusion on the lower surface of the semiconductor substrate to form the N+ region and the PSG layer on the N+ region, the sacrifice film protects the first anti-reflection coating layer from an acid etching due to the phosphorus diffusion.

In one embodiment, the sacrifice film is selected from silicon oxide or silicon oxynitride.

In one embodiment, the sacrifice film has a thickness ranging from 10 to 200 nanometers.

In one embodiment, the PSG layer and the sacrifice film are stripped by hydrofluoric acid.

In one embodiment, the second anti-reflection coating layer is either a single-layer structure or a multi-layer structure, wherein the single-layer structure is selected from the group consisting of silicon oxide, silicon oxynitride, aluminum oxide and silicon nitride, and the multi-layer structure is selected from the group consisting of silicon oxide, silicon oxynitride, aluminum oxide, silicon nitride and combinations thereof.

In one embodiment, the semiconductor substrate is doped by P+ or N+ impurity doping material.

In one embodiment, the P+ region and N+ region are formed by one of diffusion process, an ion-implantation with annealing process, and a precursor-annealing process.

In one embodiment, the precursor-annealing process comprises a spin coating, a screen printing, an inkjet printing and an atmospheric pressure chemical vapor deposition (APCVD) process.

In one embodiment, after the step of forming the second anti-reflection coating layer on the N+ region to construct the bifacial solar cell structure, at least one first electrode is formed in the first anti-reflection coating layer to be electrically connected to the P+ region and at least one second electrode is formed in the second anti-reflection coating layer to be electrically connected to the N+ region.

In one embodiment, during the step of forming the first anti-reflection coating layer on the P+ region, the first anti-reflection coating layer is formed on a surface of the P+ region and two opposed side portions of the semiconductor substrate.

In one embodiment, during the step of forming the sacrifice film on the first anti-reflection coating layer, the sacrifice film is formed on a surface of the first anti-reflection coating layer and two opposed side portions of the semiconductor substrate.

In one embodiment, the first anti-reflection coating layer, the sacrifice film and the second anti-reflection coating layer are formed by a CVD process selected from one of plasma-enhanced chemical vapor deposition, low pressure chemical vapor deposition, and atmospheric-pressure chemical vapor deposition.

In another embodiment, the present invention sets forth a method of forming a bifacial solar cell structure, comprising the steps of: performing boron diffusion on an upper surface of a semiconductor substrate to form a P+ region; forming a first anti-reflection coating layer on the P+ region; performing phosphorus diffusion on a lower surface of the semiconductor substrate to form an N+ region; forming a second anti-reflection coating layer on the N+ region, wherein either of the first anti-reflection coating layer and the second anti-reflection coating layer is selected from the group consisting of silicon oxide, silicon oxynitride, aluminum oxide and combinations thereof; and forming at least one first electrode in the first anti-reflection coating layer to be electrically connected to the P+ region and forming at least one second electrode in the second anti-reflection coating layer to be electrically connected to the N+ region.

DETAILED DESCRIPTION OF THE PREFERRED EMBODIMENTS

Figure 1:
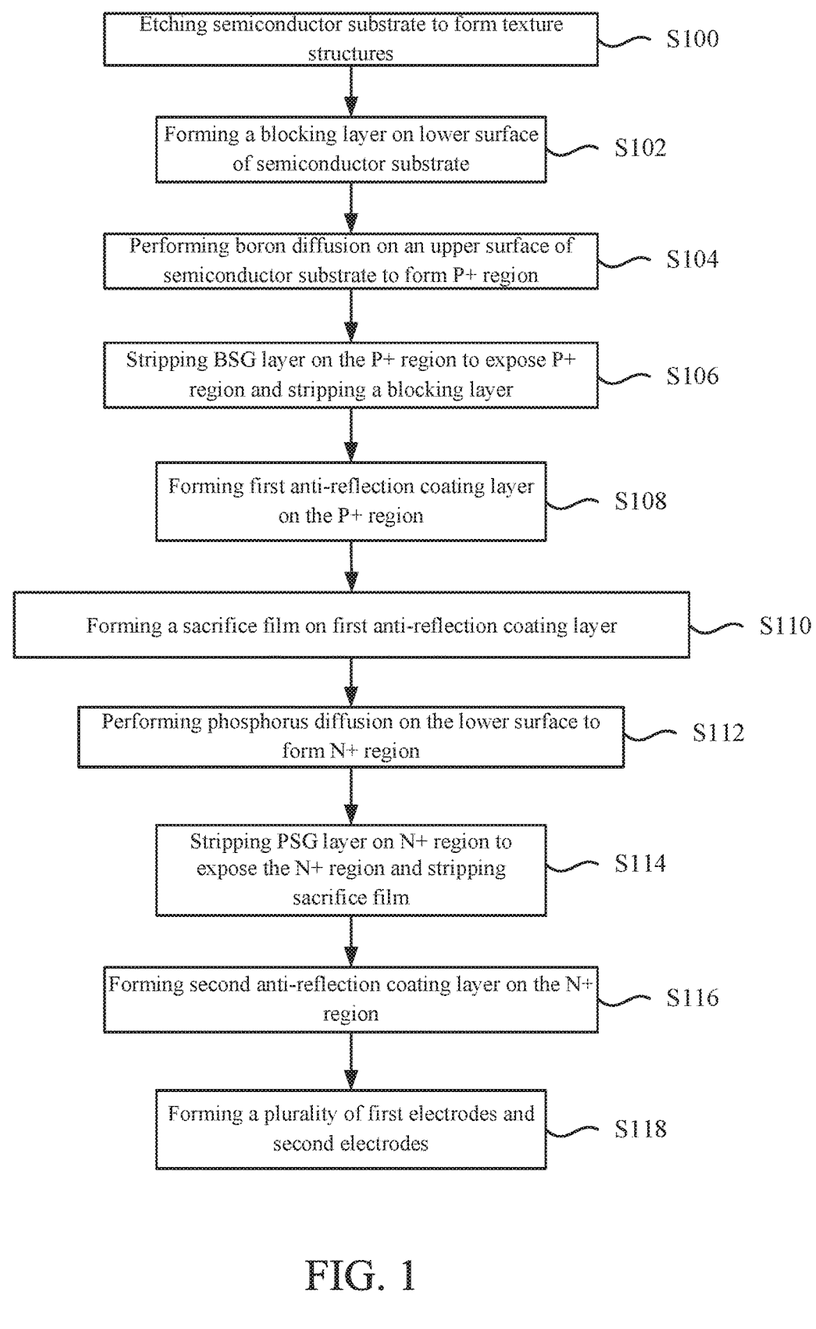
FIG. 1 is a flow chart of a method of forming a bifacial solar cell structure according to one embodiment of the present invention.

Please refer to FIG. 1, which is a flow chart of a method of forming bifacial solar cell structure according to a preferred embodiment of the present invention. FIGS. 2A-2J depict schematic cross-sectional views of a bifacial solar cell structure corresponding to the steps of the method shown in FIG. 1 according to the preferred embodiment of the present invention.

Figure 2A:
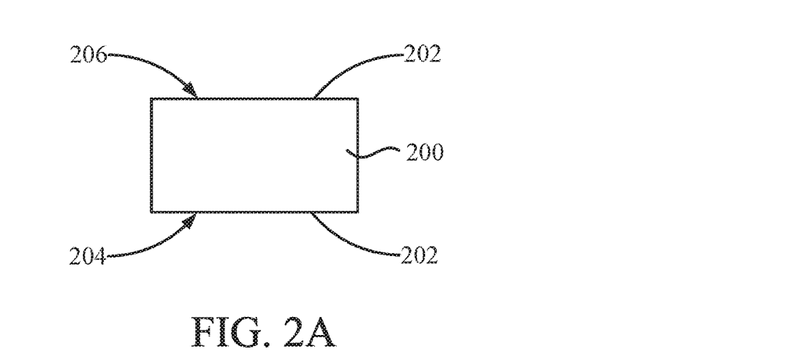
FIG. 2A is a schematic cross-sectional view of a semiconductor substrate having texture structures corresponding to step S100 of FIG. 1 according to one embodiment of the present invention.

Please refer to FIG. 2A, which is a schematic cross-sectional view of a semiconductor substrate 200 having texture structures 202 corresponding to step S100 shown in FIG. 1 according to one embodiment of the present invention. The semiconductor substrate 200 is etched to form the texture structure 202 on each of two opposite surfaces (as an upper surface 206 and a lower surface 204) of the semiconductor substrate 200, respectively. In one case, an alkaline etching is performed on the semiconductor substrate 200 to form a texture structure 202 on each of the upper surface 206 and the lower surface 204 of the semiconductor substrate 200, respectively. For example, the semiconductor substrate 200 is a silicon-based substrate.

Figure 2B:
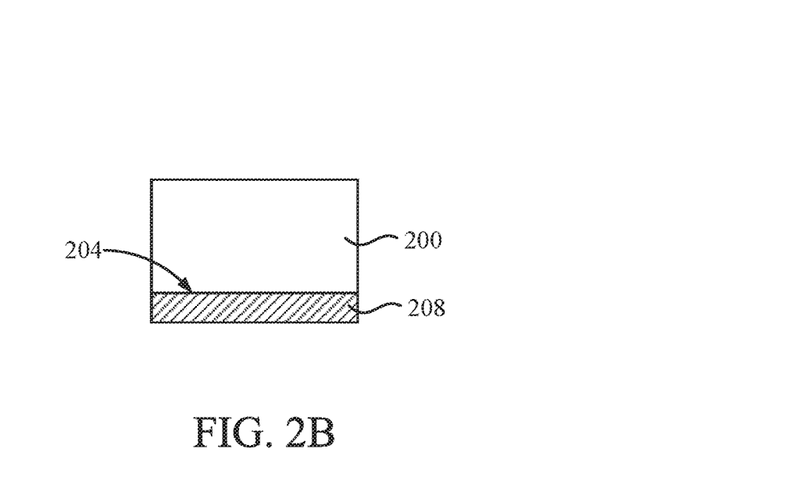
FIG. 2B is a schematic cross-sectional view of a semiconductor substrate having a blocking layer corresponding to step S102 of FIG. 1 according to one embodiment of the present invention.

Please refer to FIG. 2B, which is a schematic cross-sectional view of a semiconductor substrate 200 having a blocking layer 208 corresponding to step S102 of FIG. 1 according to one embodiment of the present invention. The blocking layer 208 is formed on the lower surface 204 of the semiconductor substrate 200. The blocking layer 208 is selected from either an organic material or an inorganic material, wherein the organic material is formed by one of chemical vapor deposition, screen printing, inkjet printing and spin coating, and wherein the inorganic material is selected from the group consisting of silicon oxide ($SiO_2$), silicon oxynitride ($SiON_x$) and silicon nitride ($SiN_x$), and is formed by one of chemical vapor deposition (CVD), screen printing, inkjet printing and spin coating.

Figure 2C:
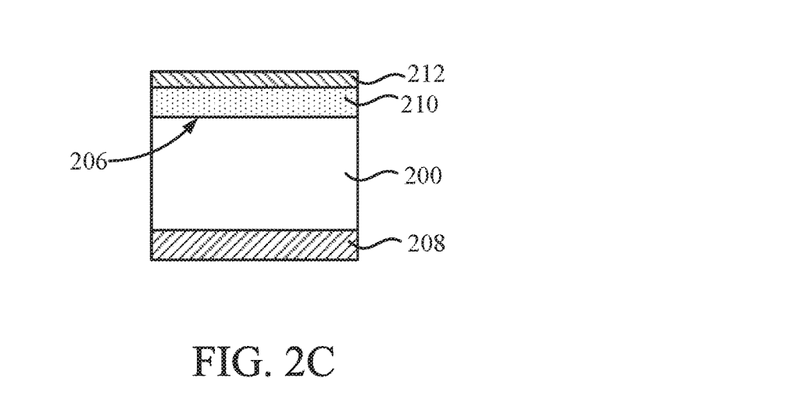
FIG. 2C is a schematic cross-sectional view of a semiconductor substrate having a P+ region corresponding to step S104 of FIG. 1 according to one embodiment of the present invention.

Please refer to FIG. 2C, which is a schematic cross-sectional view of a semiconductor substrate 200 having a P++region 210 (e.g. a medium doping region) corresponding to step S104 of FIG. 1 according to one embodiment of the present invention. The boron diffusion is performed on the upper surface 206 of the semiconductor substrate 200 to form a P+ region 210 and a boron silicon glass (BSG) layer 212 on the P+ region 210. Preferably, the blocking layer 208 is used to protect the lower surface 204 of the semiconductor substrate 200 against the damage during the boron diffusion procedure. The P+ region 210 may be a P++ region (e.g. a heavy doping region) including boron dopant impurity atoms in the P-type silicon substrate, or a P+ region including boron dopant impurity atoms in the N-type silicon substrate. In one case, the semiconductor substrate 200 is used with either P+ or N+ impurity doping material, and the P+ region 210 may be either the P++ region (e.g. a heavy doping region) including boron dopant impurities in the P-type silicon substrate or the P+ region including boron dopant impurities in the N-type silicon substrate during the boron diffusion procedure. The P+ region 210 and N+ region 218 (e.g. a medium doping region) are formed by one of diffusion process, an ion-implantation with annealing process, and a precursor-annealing process wherein the precursor-annealing process comprises a spin coating, a screen printing, an inkjet printing and an atmospheric pressure chemical vapor deposition (APCVD) process.

Figure 2D:
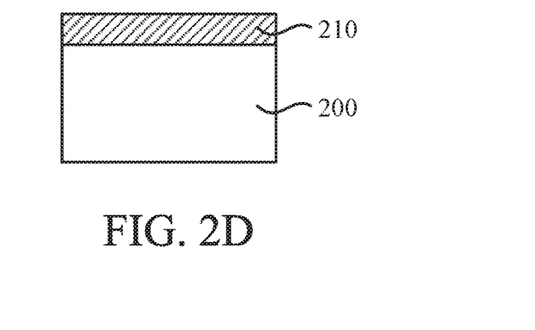
FIG. 2D is a schematic cross-sectional view of a semiconductor substrate having a blocking layer stripped corresponding to step S106 of FIG. 1 according to one embodiment of the present invention.

Please refer to FIG. 2D, which is a schematic cross-sectional view of a semiconductor substrate 200 having a blocking layer 208 stripped corresponding to step S106 of FIG. 1 according to one embodiment of the present invention. The BSG layer 212 on the P+ region 210 and the blocking layer 208 on the lower surface 204 of the semiconductor substrate 200 are stripped simultaneously to expose the P+ region 210. In one embodiment, the BSG layer 212 and blocking layer 208 are removed by hydrofluoric acid (HF).

Figure 2E:
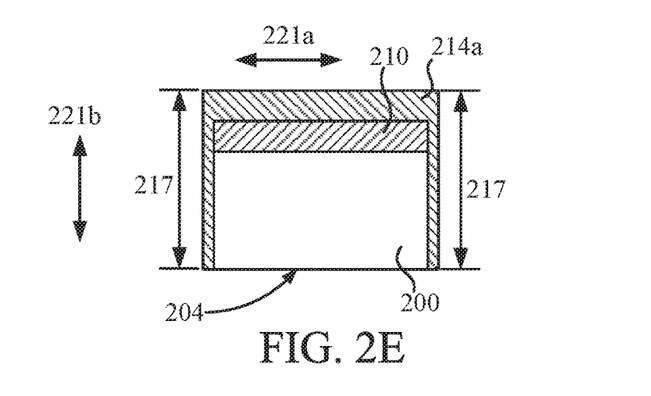
FIG. 2E is a schematic cross-sectional view of a semiconductor substrate having a first anti-reflection coating layer formed on the P+ region corresponding to step S108 of FIG. 1 according to one embodiment of the present invention.

Please refer to FIG. 2E, which is a schematic cross-sectional view of a semiconductor substrate 200 having a first anti-reflection coating layer 214a formed on the P+ region 210 corresponding to step S108 of FIG. 1 according to one embodiment of the present invention. In one preferred embodiment, the first anti-reflection coating layer 214a is formed on a surface of the P+ region 210 along the horizontal direction 221a after the step S106 of stripping the BSG layer 212 on the P+ region 210 to expose the P+ region 210 and stripping the blocking layer 208 on the lower surface 204 of the semiconductor substrate 200, simultaneously in FIG. 2D. The first anti-reflection coating layer 214a is either a single-layer structure or a multi-layer structure, wherein the single-layer structure is selected from the group consisting of silicon oxide, silicon oxynitride, aluminum oxide and silicon nitride, and the multi-layer structure is selected from the group consisting of silicon oxide ($SiO_2$), silicon oxynitride ($SiON_x$), aluminum oxide, silicon nitride ($SiN_x$) and combinations thereof. Preferably, the first anti-reflection coating layer is formed on the surface of the P+ region 210 along the horizontal direction 221a and two opposed side portions 217 of the semiconductor substrate 200 along the vertical direction 221b. In other words, the anti-reflection coating layer 214a is formed on the P+ region 210 and is extended to cover the semiconductor substrate 200 for electrically insulating the P+ region 210 from the N+ region 218 (shown in FIG. 2G), resulting in reducing the reverse current of the bifacial solar cell structure.

Figure 2F:
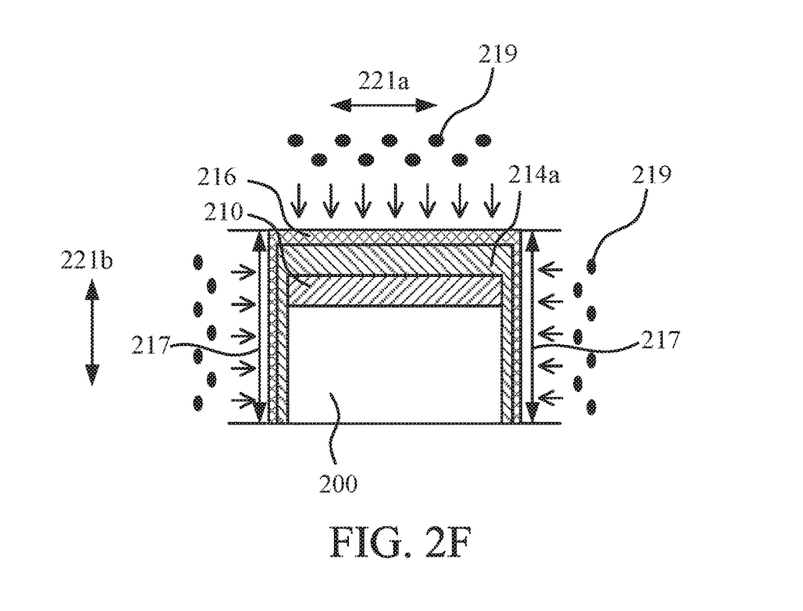
FIG. 2F is a schematic cross-sectional view of a semiconductor substrate having a sacrifice film on the first anti-reflection coating layer corresponding to step S110 of FIG. 1 according to one embodiment of the present invention.

Please refer to FIG. 2F, which is a schematic cross-sectional view of a semiconductor substrate 200 having a sacrifice film 216 on the first anti-reflection coating layer 214a corresponding to step S110 of FIG. 1 according to one embodiment of the present invention. In one case, the sacrifice film 216 is silicon oxide ($SiO_2$) or silicon oxynitride ($SiON_x$). In one embodiment, a sacrifice film 216 is formed on the surface of the first anti-reflection coating layer 214a along the horizontal direction 221a for protecting the first anti-reflection coating layer 214a from an acid etching 219 (shown in FIGS. 2F and 2G) due to a phosphorus diffusion; meanwhile, the sacrifice film 216 is further formed simultaneously on the two opposed side portions 217 of the semiconductor substrate 200 along the vertical direction 221b. In other words, the sacrifice film 216 is extended to cover the first anti-reflection coating layer 214a, the semiconductor substrate 200, the P+ region 210 and the side portions 217, for protecting the first anti-reflection coating layer 214a from the damage or defects of phosphorus diffusion during the subsequent step S110. For example, the sacrifice film 216 has a thickness ranging from 10 to 200 nanometers, preferably from 30 to 50 nanometers.

Figure 2G:
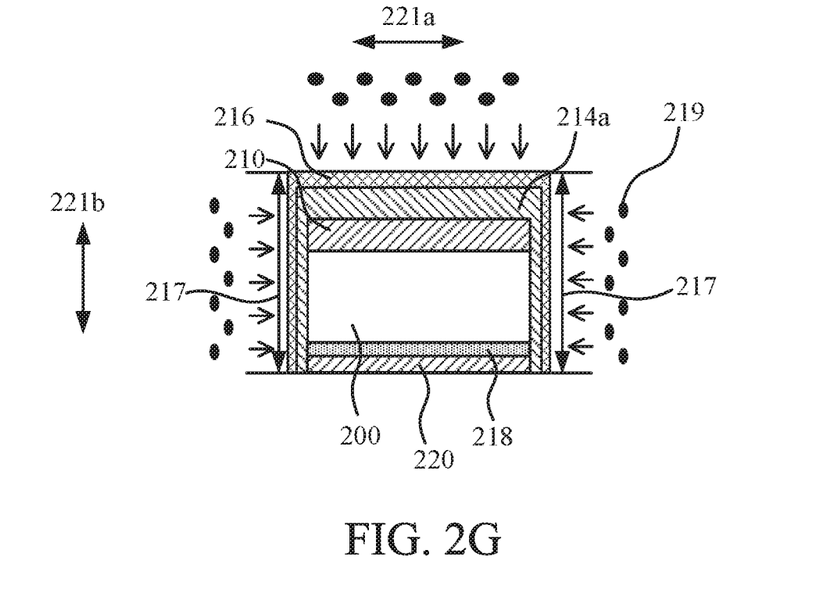
FIG. 2G is a schematic cross-sectional view of a semiconductor substrate having an N+ region and a phosphorus silicon glass (PSG) layer formed thereon corresponding to step S112 of FIG. 1 according to one embodiment of the present invention.

Please refer to FIG. 2G, which is a schematic cross-sectional view of a semiconductor substrate 200 having an N+ region 218 and a phosphorus silicon glass (PSG) layer 220 formed thereon corresponding to step S112 of FIG. 1 according to one embodiment of the present invention. The phosphorus diffusion is performed on the lower surface 204 of the semiconductor substrate 200 to form an N+ region 218 and a phosphorus silicon glass (PSG) layer 220 on the N+ region 218. The N+ region 218 may be an N++ region (e.g. a heavy doping region) including phosphorus dopant impurity atoms in the N-type silicon substrate, or an N+ region including phosphorous dopant impurity atoms in the P-type silicon substrate. In one embodiment, the semiconductor substrate 200 is used with either P+ or N+ impurity doping material.

Figure 2H:
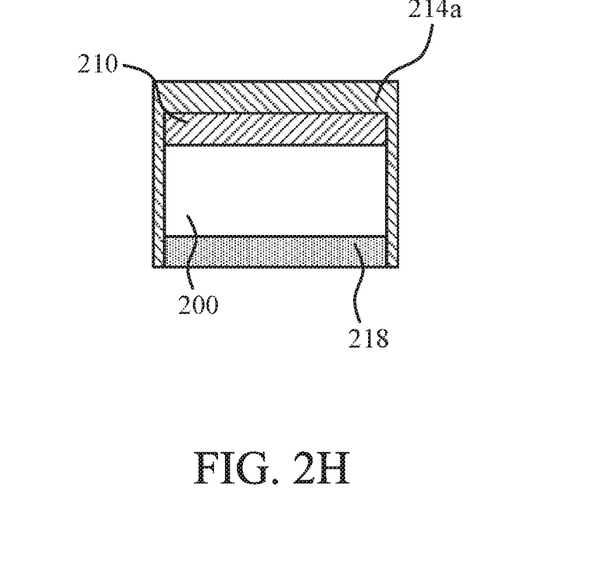
FIG. 2H is a schematic cross-sectional view of a semiconductor substrate having a PSG layer and the sacrifice film stripped corresponding to step S114 of FIG. 1 according to one embodiment of the present invention.

Please refer to FIG. 2H, which is a schematic cross-sectional view of a semiconductor substrate 200 having a PSG layer 220 and the sacrifice film 216 stripped corresponding to step S114 of FIG. 1 according to one embodiment of the present invention. The PSG layer 220 on the N+ region 218 and the sacrifice film 216 on the first anti-reflection coating layer 214a to be stripped simultaneously to expose the N+ region 218. In one embodiment, the PSG layer 220 and the sacrifice film 216 are removed by hydrofluoric acid (HF).

Figure 2I:
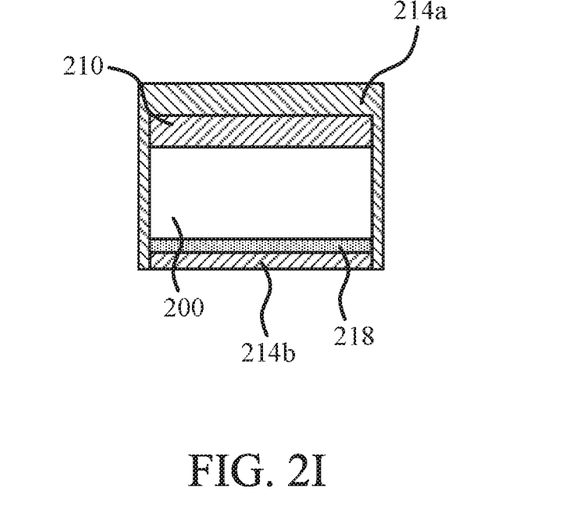
FIG. 2I is a schematic cross-sectional view of a semiconductor substrate having a second anti-reflection coating layer formed on the N+ region corresponding to step S116 of FIG. 1 according to one embodiment of the present invention.

Please refer to FIG. 2I, which is a schematic cross-sectional view of a semiconductor substrate 200 having a second anti-reflection coating layer 214b formed on the N+ region 218 corresponding to step S116 of FIG. 1 according to one embodiment of the present invention. The second anti-reflection coating layer 214b is formed on the N+ region 218. The second anti-reflection coating layer 214b is either a single-layer structure or a multi-layer structure, wherein the single-layer structure is selected from the group consisting of silicon oxide, silicon oxynitride, aluminum oxide and silicon nitride, and the multi-layer structure is selected from the group consisting of silicon oxide ($SiO_2$), silicon oxynitride ($SiON_x$), aluminum oxide, silicon nitride ($SiN_x$) and combinations thereof.

Figure 2J:
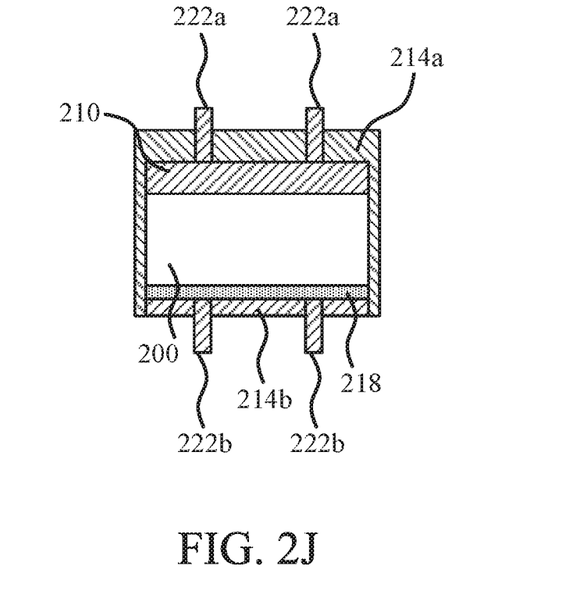
FIG. 2J is a schematic cross-sectional view of a semiconductor substrate having first electrodes and second electrodes formed during a metalization process corresponding to step S118 of FIG. 1 according to one embodiment of the present invention.

Please refer to FIG. 2J, which is a schematic cross-sectional view of a semiconductor substrate 200 having first electrodes 222a and second electrodes 222b formed during a metalization process corresponding to step S118 of FIG. 1 according to one embodiment of the present invention. A plurality of first electrodes 222a are formed in the first anti-reflection coating layer 214a to be electrically connected to the P+ region 210 and a plurality of second electrodes 222b are formed in the second anti-reflection coating layer 214b to be electrically connected to the N+ region 218.

In one embodiment of the present invention, the first anti-reflection coating layer 214a, the sacrifice film 216 and the second anti-reflection coating layer 214b are formed by a CVD process selected from one of plasma-enhanced chemical vapor deposition, low pressure chemical vapor deposition, and atmospheric-pressure chemical vapor deposition.

According to above-mentioned descriptions, the present invention employs a method of forming bifacial solar cell structure for protecting a first anti-reflection coating layer and two opposed side portions of the semiconductor substrate from phosphorus diffusion by using a sacrifice film so that pin holes or defects are not formed on the first anti-reflection coating layer and on two opposed side portions of the semiconductor substrate. Furthermore, the method of forming bifacial solar cell structure is for forming the first anti-reflection coating layer to be disposed on the two opposed side portions of the semiconductor substrate for electrically insulating the P+ region from the N+ region.

As is understood by a person skilled in the art, the foregoing preferred embodiments of the present invention are illustrative rather than limiting of the present invention. It is intended that they cover various modifications and similar arrangements be included within the spirit and scope of the present invention, the scope of which should be accorded the broadest interpretation so as to encompass all such modifications and similar structures.

What is claimed is:

1. A method of forming a bifacial solar cell structure, comprising the steps of:
    performing boron diffusion on a first surface of a semiconductor substrate to form a P+ region and a boron silicon glass (BSG) layer on the P+ region;
    stripping the BSG layer on the P+ region to expose the P+ region;
    forming a first anti-reflection coating layer on the P+ region;
    forming a sacrifice film on the first anti-reflection coating layer;
    performing phosphorus diffusion on a second surface of the semiconductor substrate to form an N+ region and a phosphorus silicon glass (PSG) layer on the N+ region;
    stripping the PSG layer on the N+ region to expose the N+ region and stripping the sacrifice film on the first anti-reflection coating layer; and
    forming a second anti-reflection coating layer on the N+ region.

2. The method of forming the bifacial solar cell structure of claim 1, before the step of performing the boron diffusion on the first surface of the semiconductor substrate to form the P+ region and the BSG layer on the P+ region, further comprising the steps of:
    performing alkaline etching on the semiconductor substrate to form a texture structure on each of the first surface and the second surface of the semiconductor substrate, respectively; and
    forming a blocking layer on the second surface of the semiconductor substrate.

3. The method of forming the bifacial solar cell structure of claim 2, wherein the blocking layer is selected from either an organic material or an inorganic material, wherein the organic material is formed by one of chemical vapor deposition, screen printing, inkjet printing and spin coating, and wherein the inorganic material is selected from the group consisting of silicon oxide, silicon oxynitride and silicon nitride, and is formed by one of chemical vapor deposition, screen printing, inkjet printing and spin coating.

4. The method of forming the bifacial solar cell structure of claim 1, wherein the first anti-reflection coating layer is either a single-layer structure or a multi-layer structure, wherein the single-layer structure is selected from the group consisting of silicon oxide, silicon oxynitride, aluminum oxide and silicon nitride, and the multi-layer structure is selected from the group consisting of silicon oxide, silicon oxynitride, aluminum oxide, silicon nitride and combinations thereof.

5. The method of forming the bifacial solar cell structure of claim 1, wherein during the step of performing the phosphorus diffusion on the second surface of the semiconductor substrate to form the N+ region and the PSG layer on the N+ region, the sacrifice film protects the first anti-reflection coating layer from an acid etching due to the phosphorus diffusion.

6. The method of forming the bifacial solar cell structure of claim 1, wherein the sacrifice film is selected from silicon oxide or silicon oxynitride.

7. The method of forming the bifacial solar cell structure of claim 1, wherein the sacrifice film has a thickness ranging from 10 to 200 nanometers for protecting the first anti-reflection coating layer from an acid etching due to the phosphorus diffusion.

8. The method of forming the bifacial solar cell structure of claim 1, wherein the PSG layer and the sacrifice film are stripped by hydrofluoric acid.

9. The method of forming the bifacial solar cell structure of claim 1, wherein the second anti-reflection coating layer is either a single-layer structure or a multi-layer structure, wherein the single-layer structure is selected from the group consisting of silicon oxide, silicon oxynitride, aluminum oxide and silicon nitride, and the multi-layer structure is selected from the group consisting of silicon oxide, silicon oxynitride, aluminum oxide, silicon nitride and combinations thereof.

10. The method of forming the bifacial solar cell structure of claim 1, wherein the semiconductor substrate is doped by P+ or N+ impurity doping material.

11. The method of forming the bifacial solar cell structure of claim 1, wherein the P+ region and N+ region are formed by one of diffusion process, an ion-implantation annealing process, and a precursor-annealing process.

12. The method of forming the bifacial solar cell structure of claim 11, wherein the precursor-annealing process comprises a spin coating, a screen printing, an inkjet printing and an atmospheric pressure chemical vapor deposition (APCVD) process.

13. The method of forming the bifacial solar cell structure of claim 1, after the step of forming the second anti-reflection coating layer on the N+ region to construct the bifacial solar cell structure, further comprising a step of forming at least one first electrode in the first anti-reflection coating layer to be electrically connected to the P+ region and forming at least one second electrode in the second anti-reflection coating layer to be electrically connected to the N+ region.

14. The method of forming the bifacial solar cell structure of claim 1, during the step of forming the first anti-reflection coating layer on the P+ region, further comprising a step of forming the first anti-reflection coating layer on a surface of the P+ region along a horizontal direction and two opposed side portions, which adjoin the surface of the P+ region, of the semiconductor substrate along a vertical direction for electrically insulating the P+ region from the N+ region.

15. The method of forming the bifacial solar cell structure of claim 1, during the step of forming the sacrifice film on the first anti-reflection coating layer, further comprising a step of forming the sacrifice film on a surface of the first anti-reflection coating layer along a horizontal direction and two opposed side portions, which adjoin the surface of the first anti-reflection coating layer, of the semiconductor substrate along a vertical direction.

16. The method of forming the bifacial solar cell structure of claim 1, wherein the first anti-reflection coating layer, the sacrifice film and the second anti-reflection coating layer are formed by a CVD process selected from one of plasma-enhanced chemical vapor deposition, low pressure chemical vapor deposition, and atmospheric-pressure chemical vapor deposition.

17. A method of forming a bifacial solar cell structure, comprising the steps of:
- performing boron diffusion on an upper surface of a semiconductor substrate to form a P+ region;
- forming a first anti-reflection coating layer on a surface of the P+ region along a horizontal direction and two opposed side portions, which adjoin the surface of the P+ region, of the semiconductor substrate along a vertical direction for electrically insulating the P+ region from an N+ region;
- performing phosphorus diffusion on a lower surface of the semiconductor substrate to form the N+ region;
- forming a second anti-reflection coating layer on the N+ region, wherein either of the first anti-reflection coating layer and the second anti-reflection coating layer is selected from the group consisting of silicon oxide, silicon oxynitride, aluminum oxide, silicon nitride and combinations thereof; and
- forming at least one first electrode in the first anti-reflection coating layer to be electrically connected to the P+ region and forming at least one second electrode in the second anti-reflection coating layer to be electrically connected to the N+ region.

* * * * *